United States Patent [19]

Matsui

[11] Patent Number: 5,113,374

[45] Date of Patent: May 12, 1992

[54] MOS TYPE SEMICONDUCTOR MEMORY DEVICE HAVING A WORD LINE RESETTING CIRCUIT

[75] Inventor: Yoshinori Matsui, Tokyo, Japan

[73] Assignee: NEC Corporation, Tokyo, Japan

[21] Appl. No.: 574,729

[22] Filed: Aug. 30, 1990

[30] Foreign Application Priority Data

Aug. 30, 1989 [JP] Japan ................. 2-226080

[51] Int. Cl.⁵ ............................................. G11C 7/00
[52] U.S. Cl. ............................. 365/227; 365/189.06; 365/203; 365/204
[58] Field of Search ............ 365/189.06, 227, 230.06, 365/203, 204, 200

[56] References Cited

U.S. PATENT DOCUMENTS 4,409,679  10/1983  Kurafuji et al. ............. 365/227

FOREIGN PATENT DOCUMENTS

| 0058321 | 5/1979 | Japan | 365/227 |
| 0013497 | 1/1986 | Japan | 365/189.06 |
| 0194695 | 8/1986 | Japan | 365/189.06 |
| 0012996 | 1/1987 | Japan | 365/189.06 |

Primary Examiner—Joseph A. Popek
Assistant Examiner—Jack A. Lane
Attorney, Agent, or Firm—Sughrue, Mion, Zinn, Macpeak & Seas

[57] ABSTRACT

A MOS type semiconductor memory device provided with an improved word line reset circuit. The memory device includes word lines and digit lines intersecting with the word lines; a precharge circuit for precharging the digit lines during a precharge period; a row decoder provided for selecting one of the word lines; and the word line reset circuit which includes a word line reset circuit connected between a reference potential and the word lines, respectively, with the word line resetting circuit being adapted to provide a current path between the reference potential and a corresponding one of the word lines during the precharge period and a current path between the reference potential and each of the non-selected word lines during the active period; and a control circuit for setting a resistance of the current path of the word line resetting circuit at a relatively small value during the active period and to a relatively large value during the precharge period.

6 Claims, 4 Drawing Sheets

MOS TYPE SEMICONDUCTOR MEMORY DEVICE HAVING A WORD LINE RESETTING CIRCUIT

BACKGROUND OF THE INVENTION

The present invention relates to a MOS type semiconductor memory device constituted with MOS transistors and, particularly, to a MOS type semiconductor memory device having a redundancy function and transistors for resetting word lines.

In a MOS type semiconductor memory device (MOS memory) such as DRAM or SRAM, etc., a number of memory cells are arranged in a matrix form of rows (X) and colums (Y), word lines for selecting memory cells in the respective rows are arranged in the row direction and digit lines for transmitting data of memory cells in the respective columns are arranged in the column direction. For a reset period, the word lines are set at a reference potential such as ground potential through word line resetting transistors. In this case, the respective digit lines have been precharged to a predetermined voltage. For an active period, only one word line is selected and its potential is raised to a power source level. The remaining word lines are connected through the word line resetting transistors to the reference potential.

In a MOS memory constructed as mentioned above, it is assumed that there is a defective column and there is a leak current path between a digit line and a word line in the defective column. In this case, the function of the MOS memory is maintained by substituting a redundant column provided preliminarily for the defective column. However, since, in this case, the digit line in the defective column is still precharged, a current flows from the precharge power source through the leak current path, the word line and the resetting transistor to the reference potential during the reset period, causing power consumption during resetting (stand-by period) to be increased.

SUMMARY OF THE INVENTION

An object of the present invention is to provide a MOS type semiconductor memory device capable of lowering power consumption caused by current flowing through a short-circuit between a word line and a digit line when the digit line is replaced by a redundant digit line.

According to the present invention, a MOS type semiconductor memory device including a plurality of word lines for selecting a predetermined address of a memory cell array and a plurality of word line resetting transistors each provided between each word line and a ground potential point for connecting, during a word line selecting operation, the non-selected word lines and, during precharge operation, the respective word lines to the ground potential point, includes means for making current flowing between the respective word lines and the ground potential point during the precharge period smaller than current flowing through the non-selected word lines during the word line selecting period.

DETAILED DESCRIPTION OF THE PREFERRED EMBODIMENTS

A conventional MOS memory will be described with reference to FIGS. 1 and 2.

Memory cells MC are arranged in a matrix form of rows (X) and columns (Y). In the row direction, word lines WL1 to WLm are arranged and, in the column direction, digit lines D1 to Dn are arranged. These digit lines D1 to Dn are connected to a precharge power source terminal Vp via a precharge transistor QP having a gate supplied with a precharge signal P1.

The word lines WL1 to WLm are connected to row decoder units 1-1 to 1-m, respectively. The row decoder unit 1-1 is composed of a dynamic NAND gate formed of series connected N channel MOS transistors (NMOSTs) Q1 to Q3 to gates of which address signals X1 to X3 are supplied, respectively, and a P channel MOS transistor (PMOST) Q4, an inversion latch portion composed of PMOSTs Q5 and Q6 and an NMOST Q7, and a word drive portion composed of NMOSTs Q8 and Q9. An NMOST Q10 is a word line resetting transister having a gate connected to an output node N1 of the NAND gate.

The remaining row decoder units have the same constructions as the decoder unit 1-1 except that combinations of true and complement of the address signals X1 to X3 therefor.

In each X decoder unit 1, when it is not selecting a corresponding word line, the node N1 has been precharged to the power source level.

A drain of the transistor Q10 is connected to a word line WL, its gate to the node N1 and its source to the ground potential point.

When the row decoder 1 is not selecting a corresponding word line, namely, while its operation is in a word line selection mode or when it is operating in precharge mode, the word line WL is discharged to ground potential through the transistor Q10. The transistor Q10 functions, mainly, to prevent the non-selected word lines WL from floating.

With an increase of integration density of MOS type semiconductor memory device, the use of redundancy circuit is becoming usual. In the redundancy system, it is usual to replace a unit including a defective cell in a memory cell array and a word line and a digit line associated therewith by a new unit. Further, the redundancy circuit operates to produce a inhibit signal for making a word line drive signal for the word line associated with the defective cell and an activation signal of a column selection switch for the digit line associated with the defective cell inoperable. The redundancy circuit also operates to make a drive signal for a redundant word line or a column selection switch activation signal of a redundant digit line operable.

Figure 1:
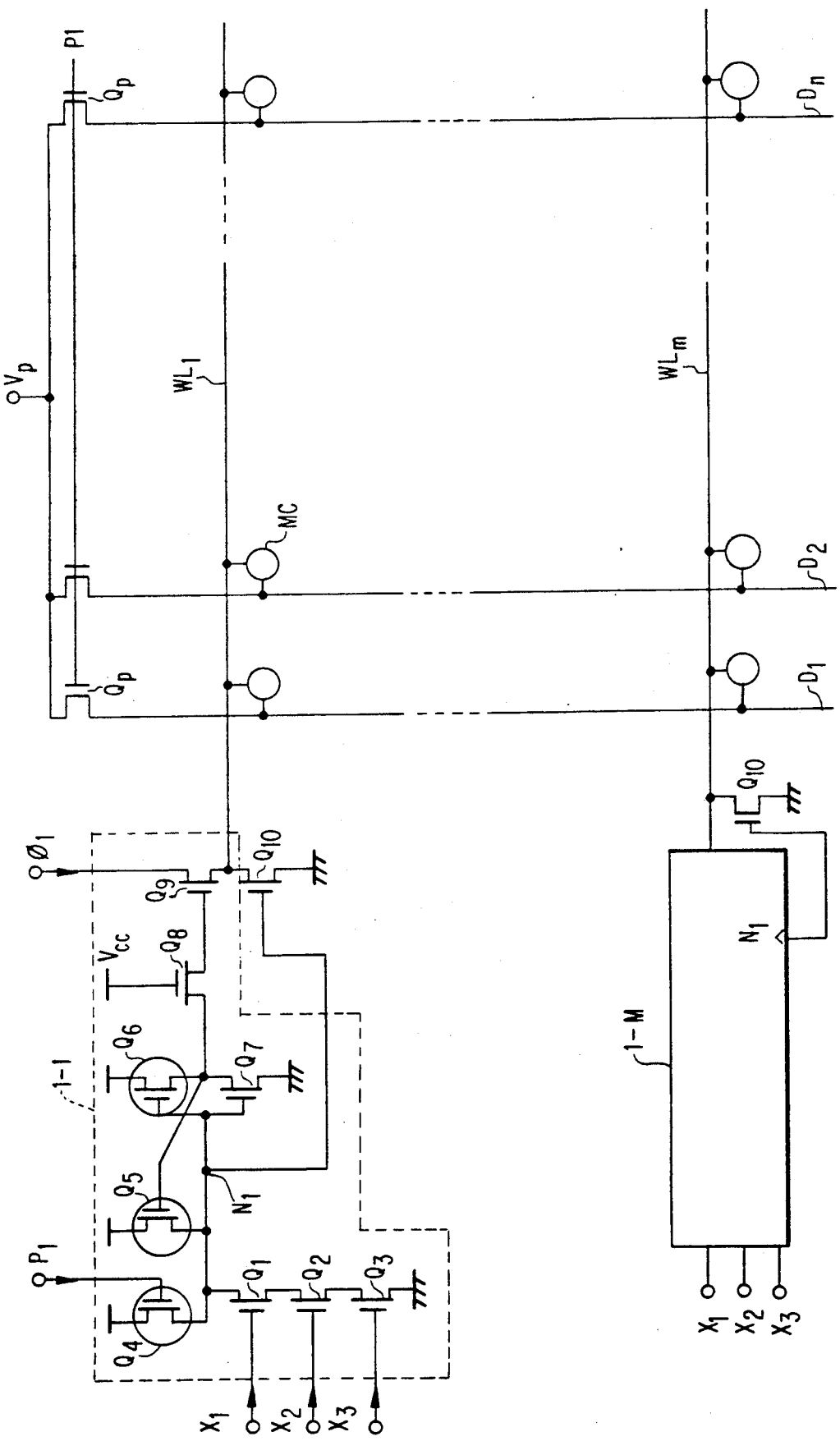
FIG. 1 is a block circuit diagram showing a main portion of a conventional MOS memory.
Figure 2:
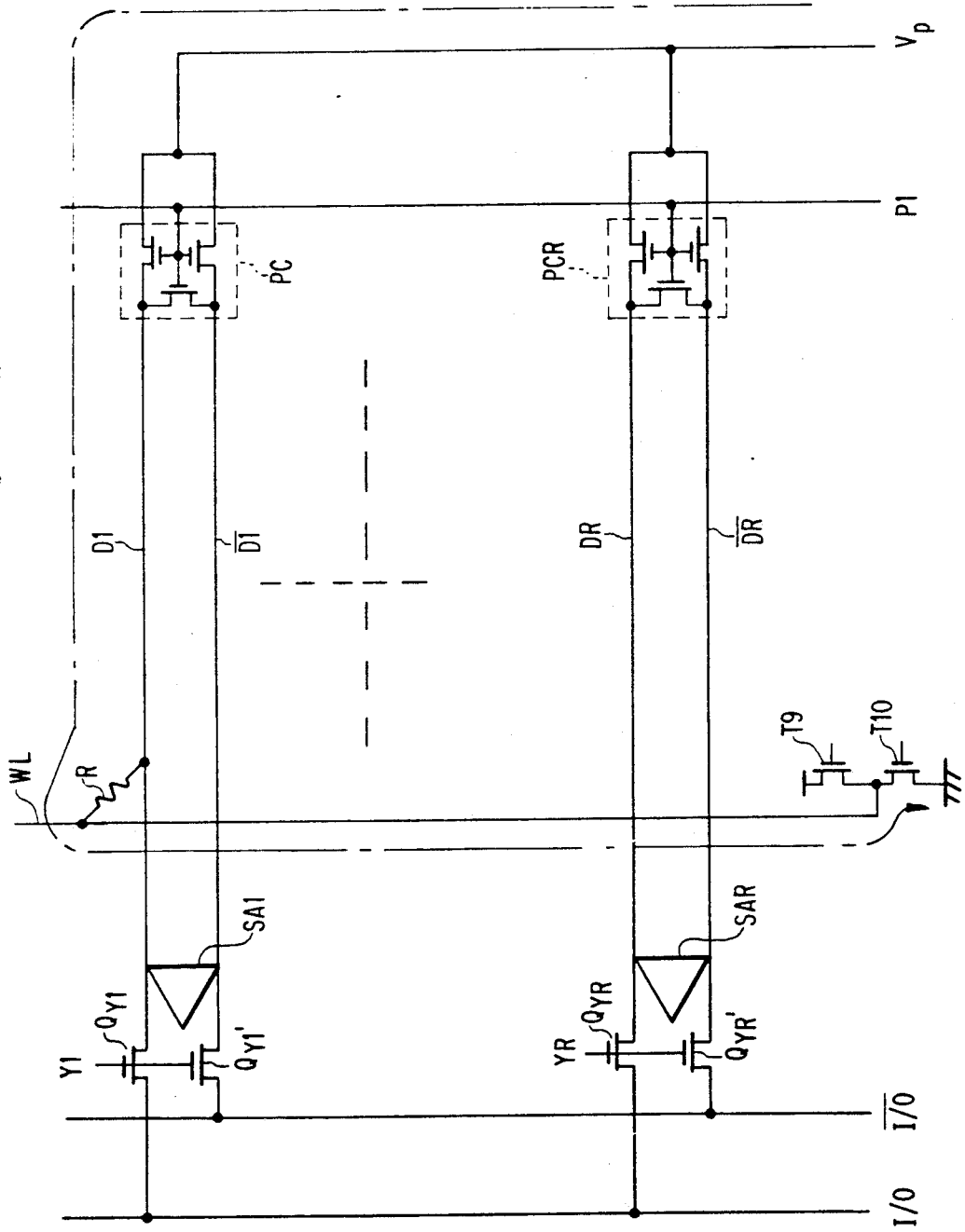
FIG. 2 is a diagram illustrating a problem of leak current path in the conventional MOS memory.

Although, in FIG. 1, the digit lines D1 to Dn are provided for the columns, respectively, it should be noted that, as shown in FIG. 2 which shows some memory cells in more detail, each of the digit lines includes a pair of digit lines such as D1 and $\overline{D1}$ and these digit line pairs are precharged by respective precharge circuits PC.

It is now assumed that, for a short-circuit (represented by a resistance R in FIG. 2) of the digit line D1 and the word line WL, the digit line pair D1 and $\overline{D1}$ are replaced by a redundancy digit line pair DR and $\overline{DR}$, as shown in FIG. 2.

As mentioned previously, the Y switches QY1 and QY1' are not activated due to the generation of the inhibit signal inhibiting an activation of the Y switch when the redundancy circuit is used. Instead thereof, the redundancy Y switches QYR and QYR' are activated. Therefore, signals on the redundancy digit line pair DR and $\overline{DR}$ are sent to input/output lines I/O and $\overline{I/O}$.

For the excluded digit lines D1 and $\overline{D1}$, a sense amplifier SA1 is still operative although the Y switches QY1 and QY1' are not. Therefore, the precharge is performed for the digit lines D1 and $\overline{D1}$.

The conventional MOS type semiconductor memory device mentioned hereinbefore includes the word line resetting transistors Q10 and, when the digit lines D1 and $\overline{D1}$ and the word line WL are short-circuited and thus the digit lines D1 and $\overline{D1}$ are replaced by the redundancy digit lines DR and $\overline{DR}$, the precharge of the digit lines D1 and $\overline{D1}$ is still performed. Therefore, leak current flows through a leak current path shown by a chain line in FIG. 2, resulting in an increase of power consumption in the stand-by period in which the precharge is to be performed.

An embodiment of the present invention will now be described with reference to FIGS. 3 and 4.

Figure 3:
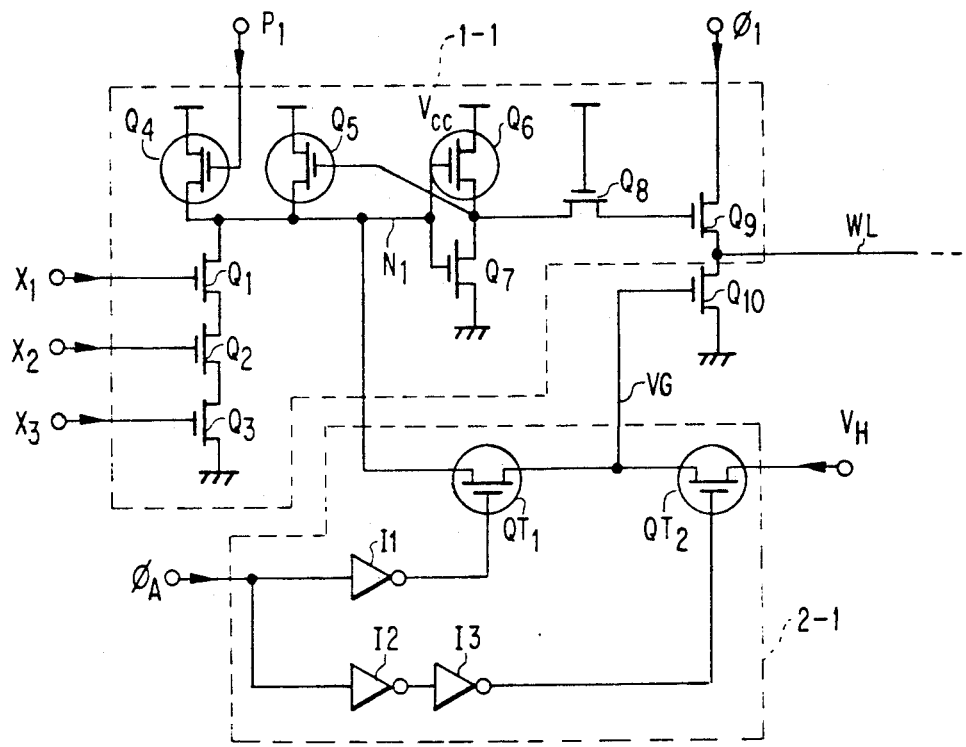
FIG. 3 is a circuit diagram showing an embodiment of the present invention.
Figure 4:
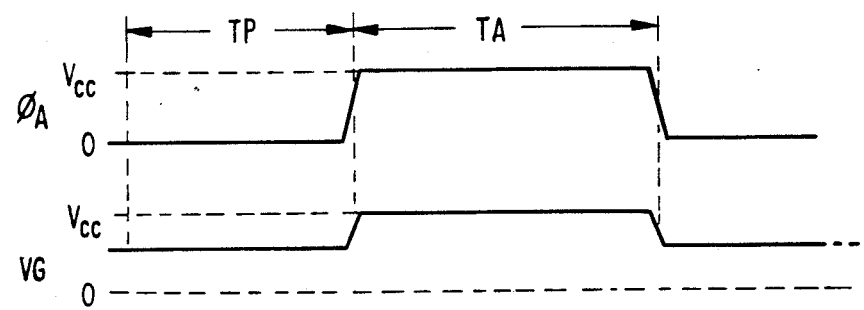
FIG. 4 is a timing chart showing an operation of the embodiment shown in FIG. 3.
Figure 5:
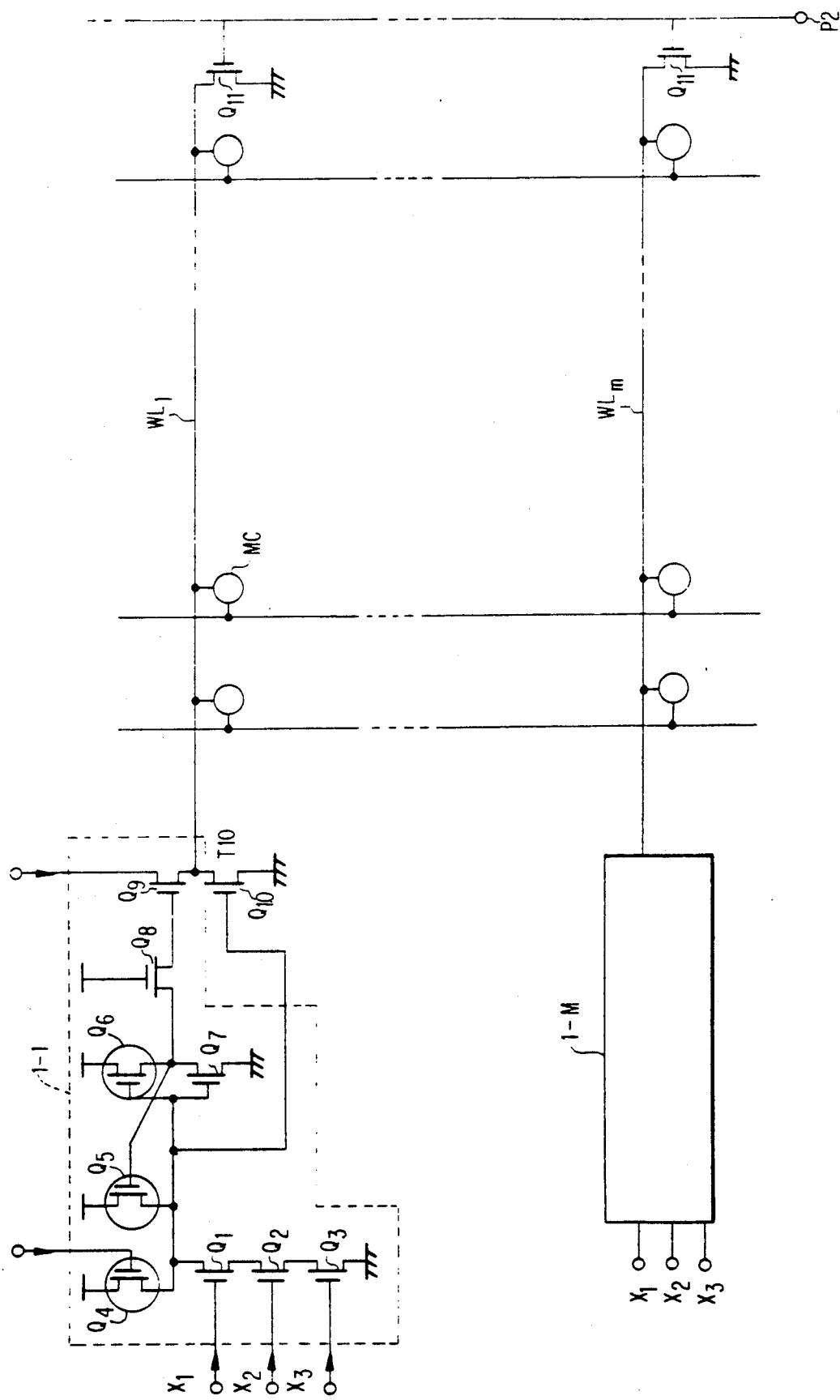
FIG. 5 is a block circuit diagram showing another embodiment of the present invention.

In FIGS. 3 to 5, elements and portions corresponding to those shown in FIGS. 1 and 2 are depicted by same reference numerals and detailed description thereof are omitted.

FIG. 3 is a circuit diagram of the first embodiment of the present invention, showing a word line drive portion thereof. Although, in the conventional MOS type semiconductor memory device shown in FIG. 1, the gate potential of the transistor Q10 is controlled by the node N1 of the row decoder unit 1-1, it is performed by an output VG of a switch circuit 2-1 in this embodiment.

The gate voltage VG is a combination of a potential supplied from the node N1 of the row decoder unit 1-1 through a transfer gate QT1 and an intermediate voltage VH supplied from an intermediate potential generation circuit (not shown) through a transfer gate QT2. VH may be, for example, about a half of the power source voltage Vcc.

A signal $\phi_A$ has a high level during the word line selection and a low level during precharge.

The transfer gate QT1 is turned on by the signal $\phi_A$ of high level and off by the same signal of low level. Similarly, the transfer gate QT2 is turned off by the signal $\phi_A$ of high level and on by the same signal of low level.

FIG. 4 shows a potential variation of the gate potential VG when the row decoder unit 1-1 is selecting a word line and when it is not selecting the word line.

The gate potential VG becomes the source voltage Vcc during the word line selection (TA) and takes an intermediate potential VH during the precharge (TP).

A floating condition of the non-selected word line WL is caused mainly by coupling noise due to a digit line and a word line adjacent thereto during the word line selection operation and there is substantially no floating during precharge operation.

Therefore, the operation is substantially not affected by reduced current flowing through the word line resetting transistor Q10 due to the gate potential VG thereof lowered to the intermediate potential VH during the precharge operation.

As shown in FIG. 2, when there is a short-circuit between the word line WL and the digit line D1, it is possible to prevent current from increasing during the stand-by period including the precharge operation period, by lowering the gate potential VG of the transistor Q10 during the precharge operation.

FIG. 5 shows a circuit diagram of a second embodiment of the present invention.

This embodiment differs from the conventional MOS semiconductor memory device shown in FIG. 1 in that a transistor Q11 is provided at an end of each word line opposite to the end to which the word line resetting transistor Q10 is connected. The transistor Q11 is controlled by a precharge signal P2 supplied to its gate.

The precharge signal P2 has a high level during the word line selection and a low level during the precharge operation.

When the word line is not selected during the word line selection period, the word line WL is discharged through the transistors Q10 and Q11.

During the precharge operation, the transistor Q11 is turned off due to the fact that its gate becomes low level and, therefore, the word line WL is discharged only through the transistor Q10.

Therefore, the current value necessary to discharge the word line during the precharge operation is reduced, resulting in the same effect as obtained in the first embodiment.

According to this embodiment, the size of the word line resetting transistor Q10 can be minimized, which is advantageous in designing masks.

As described hereinbefore, the present invention which comprises means for making current flowing between the word line and the ground potential point during precharge operation smaller than that flowing when the word line is not selected during the word line selecting operation provides an effect that an increase of power consumption during stand-by period when there is a short-circuit between the word line and the digit line, etc., is prevented.

What is claimed is:

1. A MOS type semiconductor memory device comprising a word line; a plurality of digit lines; a plurality of memory cells coupled to said word line and digit lines; precharge means for precharging said digit lines during a precharge period; a logic decoding circuit having a first output end generating a first logic signal and a second output end generating a second logic signal complementary to said first logic signal, said first and second logic signals swinging between a first voltage and a reference voltage; a drive MOS transistor having a source-drain current path coupled between said word line and a first node to which a driving voltage is applied during an active period; first means for supplying a gate of said drive transistor with said first logic signal; a reset MOS transistor having a source-drain current path coupled between said word line and a second node to which said reference voltage is applied; and a control circuit for controlling said reset MOS transistor, said control circuit including a first switch element coupled between a gate of said reset MOS transistor and a third node to which a second voltage is applied, said second voltage having an intermediate voltage between said first voltage and said reference voltage, a second switch element coupled between the gate of said reset MOS transistor and said second output end of said logic decoding circuit, second means for rendering said first switch element conductive during said precharge period and non-conductive during said active period, and third means for rendering said second switch element conductive during said active period and non-conductive during said precharge period.

2. The semiconductor memory device according to claim 1, in which said first means includes a connection MOS transistor having a source-drain current path coupled between the gate of said drive MOS transistor and said first output end, and said connection MOS transistor having a gate supplied with said first voltage.

3. The semiconductor memory device according to claim 1, in which said drive MOS transistor and said reset MOS transistor are N-channel MOS transistors, and each of said first and second switch elements is a P-channel type MOS transistor.

4. A MOS type semiconductor memory device comprising a word line; a plurality of digit lines; a plurality of memory cells coupled to said word line and digit lines; precharge means for precharging said digit lines during a precharge period; a logic decoding circuit having a first output end generating a first logic signal and a second output end generating a second logic signal complementary to said first logic signal, said first and second logic signals swinging between a first voltage and a reference voltage; a first MOS transistor having a source-drain current path coupled between a first end of said word line and a first node to which a driving voltage is applied during an active period; first means for supplying a gate of said first transistor with said first logic signal; a second MOS transistor having a source-drain current path coupled between the first end of said word line and a second node to which said reference voltage is applied; a third MOS transistor having a source-drain current path coupled between a second end of said word line and a third node supplied with said reference voltage; and second means for rendering said third MOS transistor non-conductive during said precharge period and conductive during said active period.

5. A semiconductor memory device comprising a word line; a plurality of digit lines; a plurality of memory cells coupled to said word line and digit lines; a precharge circuit for precharging said digit lines during a precharge period; a logic decoding circuit having a first output end generating a first logic signal and a second output end generating a second logic signal complementary to said first logic signal, said first and second logic signals swinging between a first voltage and a reference voltage; a drive transistor having a source-drain current path coupled between said word line and a first node to which a driving voltage is applied during an active period; a first circuit for supplying a gate of said drive transistor with said first logic signal; a reset transistor having a source-drain current path coupled between said word line and a second node to which said reference voltage is applied; and a control circuit for controlling said reset transistor, said control circuit including a first switch element coupled between a gate of said reset transistor and a third node to which a second voltage is applied, said second voltage having an intermediate voltage between said first voltage and said reference voltage, a second switch element coupled between the gate of said reset transistor and said second output end of said logic decoding circuit, a second circuit for rendering said first switch element conductive during said precharge period and non-conductive during said active period, and a third circuit for rendering said second switch element conductive during said active period and non-conductive during said precharge period.

6. A semiconductor memory device comprising a word line; a plurality of digit lines; a plurality of memory cells coupled to said word line and digit lines; a precharge circuit for precharging said digit lines during a precharge period; a logic decoding circuit having a first output end generating a first logic signal and a second output end generating a second logic signal complementary to said first logic signal, said first and second logic signals swinging between a first voltage and a reference voltage; a first transistor having a source-drain current path coupled between a first end of said word line and a first node to which a driving voltage is applied during an active period; a first circuit for supplying a gate of said first transistor with said first logic signal; a second transistor having a source-drain current path coupled between the first end of said word line and a second node to which said reference voltage is applied; a third transistor having a source-drain current path coupled between a second end of said word line and a third node supplied with said reference voltage; and a second circuit for rendering said third transistor non-conductive during said precharge period and conductive during said active period.

* * * * *